United States Patent
Akatsuka

(10) Patent No.: US 10,694,649 B2
(45) Date of Patent: Jun. 23, 2020

(54) FEEDER MAINTENANCE APPARATUS AND CONTROL METHOD OF FEEDER MAINTENANCE APPARATUS

(71) Applicant: FUJI CORPORATION, Chiryu-shi (JP)

(72) Inventor: Ryota Akatsuka, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 185 days.

(21) Appl. No.: 15/541,424

(22) PCT Filed: Jan. 14, 2015

(86) PCT No.: PCT/JP2015/050796
§ 371 (c)(1),
(2) Date: Jul. 3, 2017

(87) PCT Pub. No.: WO2016/113864
PCT Pub. Date: Jul. 21, 2016

(65) Prior Publication Data
US 2017/0359928 A1 Dec. 14, 2017

(51) Int. Cl.
*H05K 13/02* (2006.01)
*H05K 13/04* (2006.01)
(Continued)

(52) U.S. Cl.
CPC .......... *H05K 13/0417* (2013.01); *B08B 3/08* (2013.01); *B08B 5/02* (2013.01); *B08B 5/04* (2013.01);
(Continued)

(58) Field of Classification Search
CPC .......... H05K 13/0417; H05K 13/0419; H05K 13/0895; H05K 13/02; B08B 3/08; B08B 5/02; B08B 5/04; G05B 15/02
See application file for complete search history.

(56) References Cited

U.S. PATENT DOCUMENTS 4,648,486 A * 3/1987 Kayser ................... B65G 45/08
184/15.1
2008/0243438 A1* 10/2008 Okuda ............... H05K 13/0895
702/184

FOREIGN PATENT DOCUMENTS

CN 101935001 B * 6/2012
JP 10-256799 A 9/1998
(Continued)

OTHER PUBLICATIONS

Universal Instrument, Feeder 4697A Maintenance Manual, 1999, p. 19,33 (Year: 1999).*
(Continued)

*Primary Examiner* — Rocio Del Mar Perez-Velez
*Assistant Examiner* — Hung H Dang
(74) *Attorney, Agent, or Firm* — Oblon, McClelland, Maier & Neustadt, L.L.P.

(57) ABSTRACT

A feeder maintenance apparatus that acquires feeder information from a feeder which is mounted on a feeder mounting section, and controls a cleaning section to clean a sprocket section of the feeder, a feeding roller, a first gear mechanism, and a second gear mechanism, based on the feeder information. The feeder maintenance apparatus controls lubricant supply sections to supply a lubricant to a driving section of the feeder based on the acquired feeder information.

13 Claims, 7 Drawing Sheets

(51) Int. Cl.
  *H05K 13/08* (2006.01)
  *B08B 3/08* (2006.01)
  *B08B 5/02* (2006.01)
  *B08B 5/04* (2006.01)
  *G05B 15/02* (2006.01)

(52) U.S. Cl.
  CPC ......... *G05B 15/02* (2013.01); *H05K 13/0419* (2018.08); *H05K 13/0895* (2018.08)

(56) References Cited

FOREIGN PATENT DOCUMENTS

| | | | | | |
|---|---|---|---|---|---|
| JP | 2000120986 | A | * | 4/2000 | |
| JP | 2004140162 | A | * | 5/2004 | |
| JP | 2008062122 | A | * | 3/2008 | ............... B08B 5/02 |
| JP | 2009-123895 | A | | 6/2009 | |
| JP | 2010-98213 | A | | 4/2010 | |
| JP | 2011003679 | A | * | 1/2011 | |
| JP | 2011099466 | A | * | 5/2011 | |
| JP | 2014-60312 | A | | 4/2014 | |
| JP | 2014-220314 | A | | 11/2014 | |
| JP | 2014-220317 | A | | 11/2014 | |
| JP | 2014220314 | A | * | 11/2014 | |
| JP | 2014220317 | A | * | 11/2014 | |

OTHER PUBLICATIONS

The partial Supplementary European Search Report dated Jul. 23, 2018 in Patent Application 15877817.5, 22 pages.
International Search Report dated Apr. 14, 2015 in PCT/JP2015/050796 filed Jan. 14, 2015.

* cited by examiner

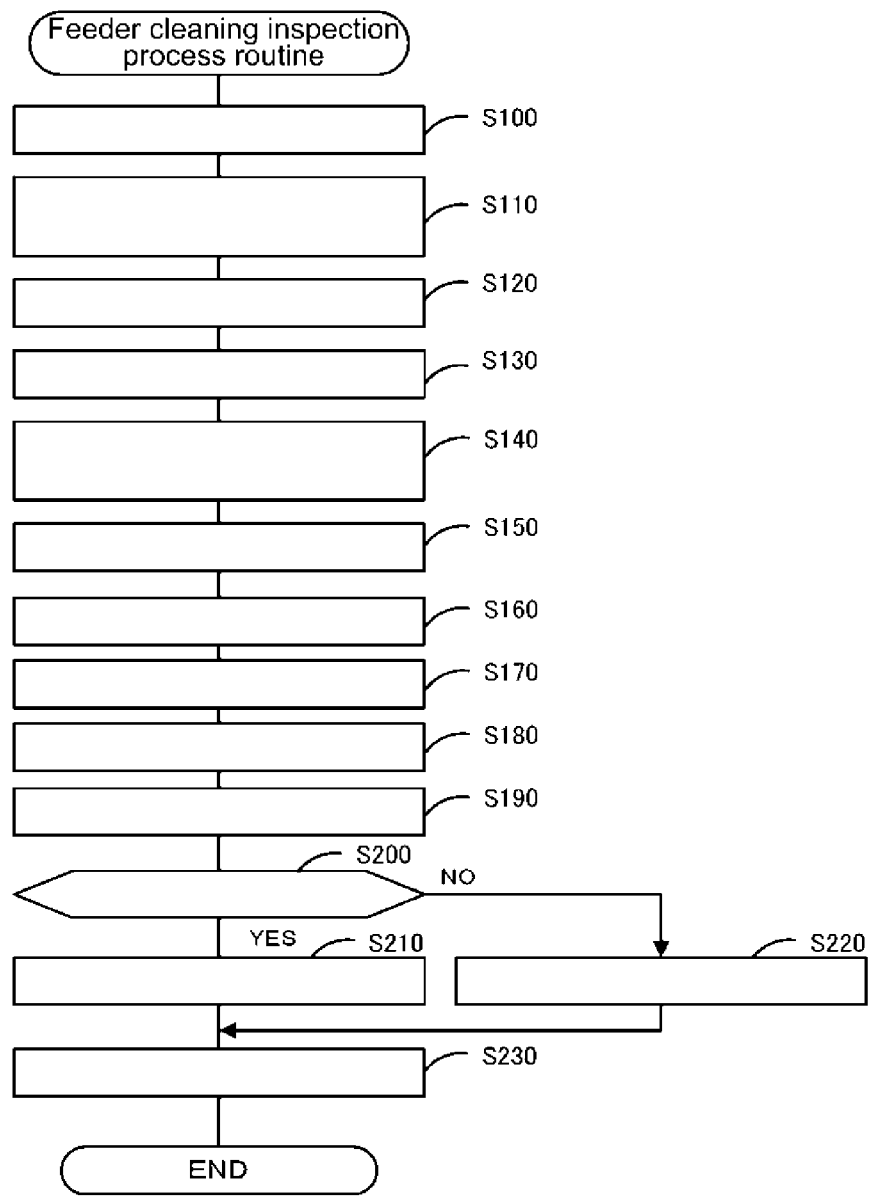

FEEDER MAINTENANCE APPARATUS AND CONTROL METHOD OF FEEDER MAINTENANCE APPARATUS

TECHNICAL FIELD

The present application relates to a feeder maintenance apparatus and a control method of the feeder maintenance apparatus.

BACKGROUND ART

In the related art, as an inspection device of a feeder which is used in a mounting device, for example, there is proposed an inspection device in which a tape feeder which is an inspection target is disposed, positional deviation is obtained by observing a pocket of a tape with a camera, and deviation in the height of a rocking lever is inspected using a dial gauge (for example, refer to PTL 1). In this apparatus, by using a main jig, it is possible to accurately and simply perform the inspection. Also proposed is an inspection device which images a component pickup section of a tape feeder and assigns ranks to properties of the tape feeder based on the image data (for example, refer to PTL 2). In this device, it is possible to logically use a feeder by detecting the properties of the feeder.

CITATION LIST

Patent Literature

PTL 1: JP-A-10-256799
PTL 2: JP-A-2009-123895

SUMMARY

However, in the devices of PTL 1 and 2 which are described above, although it is possible to automatically perform the inspection of a tape feeder which is used in amounting device, maintenance of the tape feeder may be performed before the inspection. The maintenance of the tape feeder is performed manually by an operator. Although the maintenance procedures include cleaning of driving sections, grease application, and the like, since the maintenance is performed manually, variation arises in the quality in some cases. Therefore, when the inspection of the tape feeder is performed after the maintenance, there are cases in which this influences the inspection results.

The present disclosure is made in light of this problem, and a main object is to provide a feeder maintenance apparatus and a control method of the feeder maintenance apparatus in which it is possible to further reduce variation in the quality of the maintenance.

The present disclosure adopts the following means in order to achieve the above-described main object.

A feeder maintenance apparatus of the present disclosure includes a mounting section on which is mounted a feeder which is used in a mounting device that mounts components onto a board, a lubricant supply section which supplies a lubricant to a driving section of the feeder, an acquisition section which acquires feeder information from the feeder, and a control section which controls the lubricant supply section to supply the lubricant to the driving section of the feeder which is mounted based on the acquired feeder information.

In this apparatus, the feeder information is acquired from the feeder which is mounted on the mounting section, and the lubricant supply section is controlled to supply the lubricant to the driving section of the feeder based on the acquired feeder information. In this manner, since the feeder maintenance apparatus performs the supplying of the lubricant, in comparison with a case in which the operator performs the supplying of the lubricant, it is possible to reduce variation in the quality of the maintenance.

In the feeder maintenance apparatus of the present disclosure, a configuration may be adopted in which the feeder is provided with a feeding mechanism which feeds a tape, and a member processing mechanism which feeds a sealing member which is peeled from the tape, and in which the lubricant supply section supplies the lubricant to one or more of the driving section of the feeding mechanism and the driving section of the member processing mechanism. In this apparatus, since the lubricant is supplied to the driving sections which require maintenance, it is possible to further reduce variation in the quality of the maintenance of the driving sections. Here, motors, gears, and the like may be included in the driving sections, for example.

A configuration may be adopted in which the feeder maintenance apparatus of the present disclosure further includes a supply section moving mechanism which relatively moves the feeder which is mounted and the lubricant supply section, in which the control section controls the supply section moving mechanism such that a positional relationship between the feeder and the lubricant supply section assumes a predetermined maintenance position based on the acquired feeder information, and subsequently controls the lubricant supply section to supply the lubricant. In this apparatus, it is possible to perform the maintenance process at a position corresponding to the maintenance target feeder. Here, the supply section moving mechanism may move the feeder in relation to a fixed lubricant supply section, or may move the lubricant supply section in relation to a fixed feeder, or may move both.

A configuration may be adopted in which the feeder maintenance apparatus of the present disclosure further includes a cleaning section which cleans a predetermined portion of the feeder, in which the control section controls the cleaning section to clean the predetermined portion of the feeder which is mounted based on the acquired feeder information. In this apparatus, since cleaning of the predetermined portion of the feeder is performed, in comparison with a case in which the operator performs the cleaning, it is possible to further reduce variation in the quality of the maintenance.

A feeder maintenance apparatus of the present disclosure includes a mounting section which mounts a feeder which is used in a mounting device which mounts components onto a board, a cleaning section which cleans a predetermined portion of the feeder, an acquisition section which acquires feeder information from the feeder, and a control section which controls the cleaning section to clean the predetermined portion of the feeder which is mounted based on the acquired feeder information.

In this apparatus, the feeder information is acquired from the feeder which is mounted in the mounting section, and the cleaning section is controlled to clean the predetermined portion of the feeder which is mounted based on the acquired feeder information. In this apparatus, since cleaning of the predetermined portion of the feeder is performed by the feeder maintenance apparatus, in comparison with a case in which the operator performs the cleaning, it is possible to further reduce variation in the quality of the maintenance.

In the feeder maintenance apparatus of the present disclosure, a configuration may be adopted in which the feeder is provided with a feeding mechanism which feeds a tape, and a member processing mechanism which feeds a sealing member which is peeled from the tape, and in which the cleaning section cleans one or more of the predetermined portion of the feeding mechanism and the predetermined portion of the member processing mechanism. In this apparatus, since the predetermined portions of the feeding mechanism and the member processing mechanism which require maintenance are cleaned, it is possible to further reduce variation in the quality of the maintenance of the predetermined portions. Here, a sprocket section of the feeder may be included in the predetermined portions of the feeding mechanism, for example. A roller section which pinches and feeds the sealing member may be included in the predetermined portions of the member processing mechanism, for example.

In the feeder maintenance apparatus of the present disclosure, a configuration may be adopted in which the feeder is provided with a feeding mechanism which feeds a tape, and a member processing mechanism which feeds a sealing member which is peeled from the tape, and in which the cleaning section includes an air washing section which cleans one or more of the feeding section of the feeding mechanism and the feeding section of the member processing mechanism using air. In this apparatus, it is possible to remove foreign matter such as dust which is present on the feeding section using air. At this time, the cleaning section may include an air supply section which blows air onto the feeding section, and a suction section which sucks in air via the feeding section. In this apparatus, air is supplied using the air supply section, and it is possible to collect foreign matter such as dust using the suction section.

In the feeder maintenance apparatus of the present disclosure, a configuration may be adopted in which the feeder is provided with a feeding mechanism which feeds a tape, and a member processing mechanism which feeds a sealing member which is peeled from the tape, and in which the cleaning section includes a liquid washing section which cleans one or more of the driving section of the feeding mechanism and the driving section of the member processing mechanism using a washing liquid. In this apparatus, it is possible to more suitably clean the driving sections of the feeding mechanism and the member processing mechanism using the washing liquid. At this time, the cleaning section may include a washing liquid supply section which supplies the washing liquid to the driving sections, and a collection section which collects the washing liquid via the driving sections. In this apparatus, the washing liquid is supplied using the washing liquid supply section, and it is possible to collect the washing liquid after the washing using the collection section.

A configuration may be adopted in which the feeder maintenance apparatus of the present disclosure further includes a cleaning section moving mechanism which relatively moves the feeder which is mounted and the cleaning section, in which the control section controls the cleaning section moving mechanism such that a positional relationship between the feeder and the cleaning section assumes a predetermined cleaning position based on the acquired feeder information, and subsequently controls the cleaning section to clean the predetermined portion of the feeder. In this apparatus, it is possible to perform the maintenance process at a position corresponding to the maintenance target feeder. Here, the cleaning section moving mechanism may move the feeder in relation to a fixed cleaning section, or may move the cleaning section in relation to a fixed feeder, or may move both.

A configuration may be adopted in which the feeder maintenance apparatus of the present disclosure further includes an inspection unit which includes one or more of a feed accuracy inspection section which inspects a feed accuracy of the tape in the feeder, a torque inspection section of a mechanism which feeds the tape in the feeder, and a splicing inspection section which inspects a detection sensor which detects a splicing portion of the tape in the feeder, and a cleaning section which cleans the predetermined portion of the feeder, in which the control section controls the cleaning section to clean the predetermined portion of the feeder, and subsequently causes the inspection unit to perform inspection. In this apparatus, after cleaning the feeder using the cleaning section, inspection of the feeder is performed using the inspection unit. Therefore, in this apparatus, since it is possible to perform the inspection of the feeder in a state in which variation in the quality of the maintenance is further reduced, is possible to obtain more suitable inspection results.

A control method of a feeder maintenance apparatus of the present disclosure in which a computer controls a feeder maintenance apparatus which is provided with a mounting section on which is mounted a feeder which is used in a mounting device that mounts components onto a board, and a lubricant supply section which supplies a lubricant to a driving section of the feeder, in which the method includes (a) a step of acquiring feeder information from the feeder, and (b) a step of controlling the lubricant supply section to supply the lubricant to the driving section of the feeder which is mounted based on the acquired feeder information.

In this control method, the feeder information is acquired from the feeder which is mounted in the mounting section, and the lubricant supply section is controlled to supply the lubricant to the driving section of the feeder which is mounted based on the feeder information which is acquired. In this control method, since the feeder maintenance apparatus performs the supplying of the lubricant, in comparison with a case in which the operator performs the supplying of the lubricant, it is possible to further reduce variation in the quality of the maintenance. In this control method, a step which performs a process of any of the feeder maintenance apparatuses which are described above may be added, and the configuration of any of the feeder maintenance apparatuses which are described above may be adopted.

A control method of a feeder maintenance apparatus of the present disclosure in which a computer controls a feeder maintenance apparatus which is provided with a mounting section on which is mounted a feeder which is used in a mounting device that mounts components onto a board, and a cleaning section which cleans a predetermined portion of the feeder, in which the method includes (a) a step of acquiring feeder information from the feeder, and (b) a step of controlling the cleaning section to clean the predetermined portion of the feeder which is mounted based on the acquired feeder information.

In this control method, the feeder information is acquired from the feeder that is mounted on the mounting section, and the cleaning section is controlled to clean the predetermined portion of the feeder that is mounted based on the acquired feeder information. In this apparatus, since cleaning of the predetermined portion of the feeder is performed by the feeder maintenance apparatus, in comparison with a case in which the operator performs the cleaning, it is possible to reduce variation in the quality of the maintenance. In this control method, a step which performs a process of any of the feeder maintenance apparatuses which are described above may be added, and the configuration of any of the feeder maintenance apparatuses which are described above may be adopted.

BRIEF DESCRIPTION OF DRAWINGS

FIG. 7 is a flowchart illustrating an example of a feeder cleaning inspection process routine.

DESCRIPTION OF EMBODIMENTS

Figure 1:
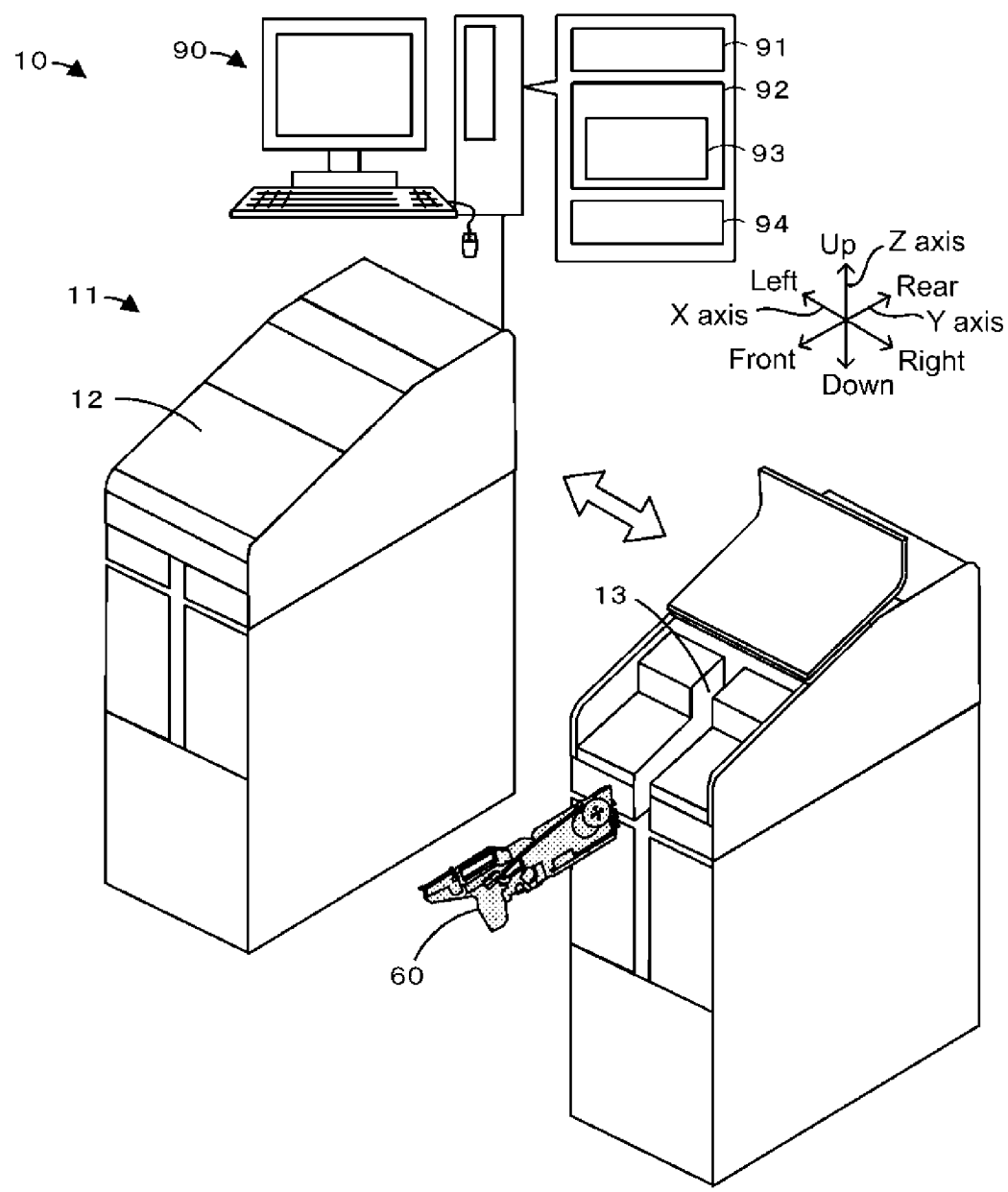
FIG. 1 is a schematic diagram of feeder maintenance system 10.
Figure 2:
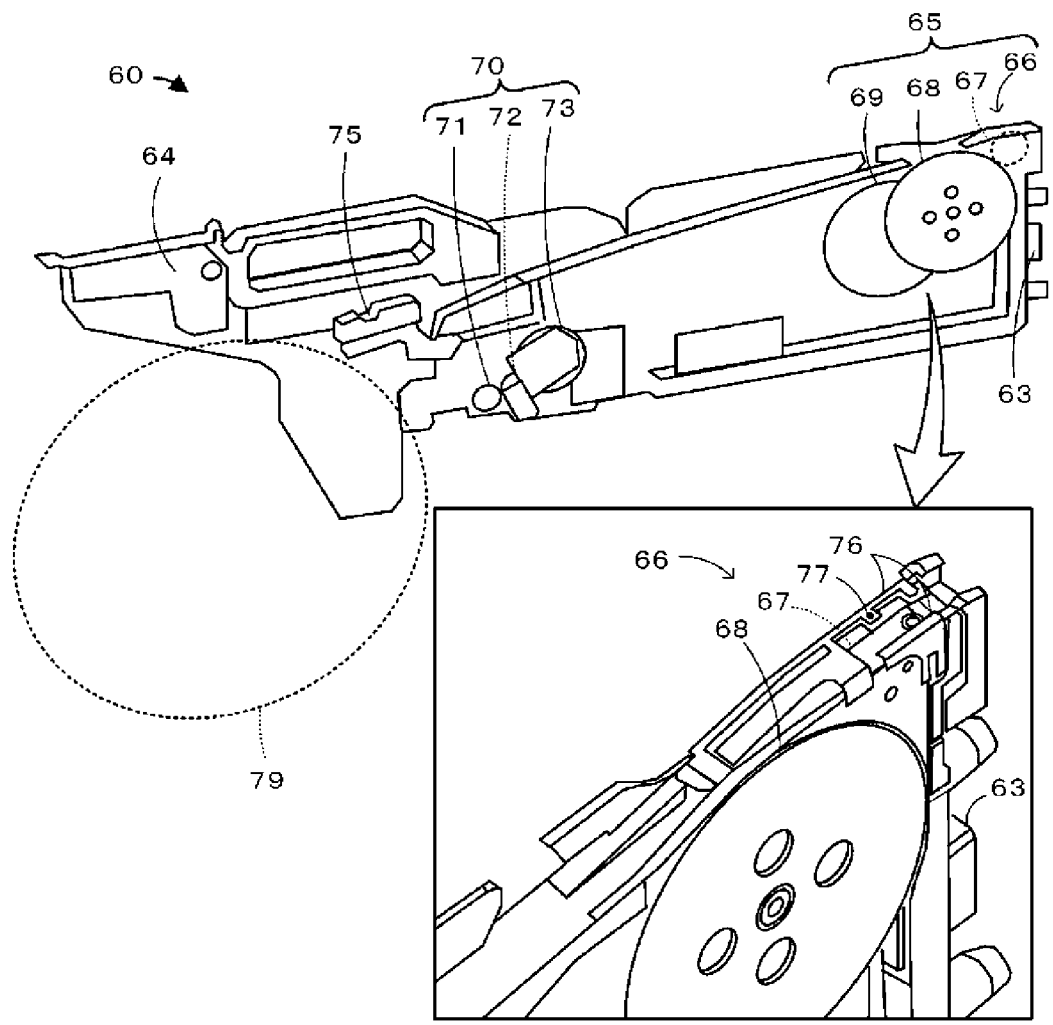
FIG. 2 is a schematic diagram of feeder 60.
Figure 3:
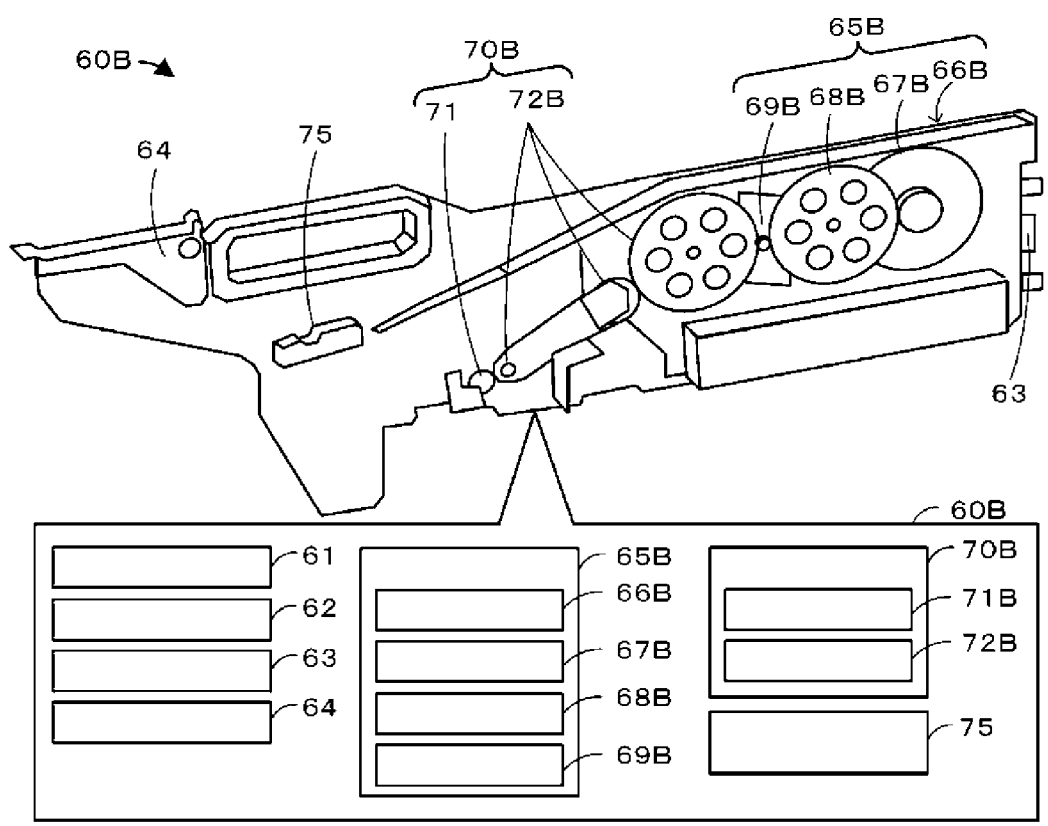
FIG. 3 is a schematic diagram of feeder 60B.
Figure 4:
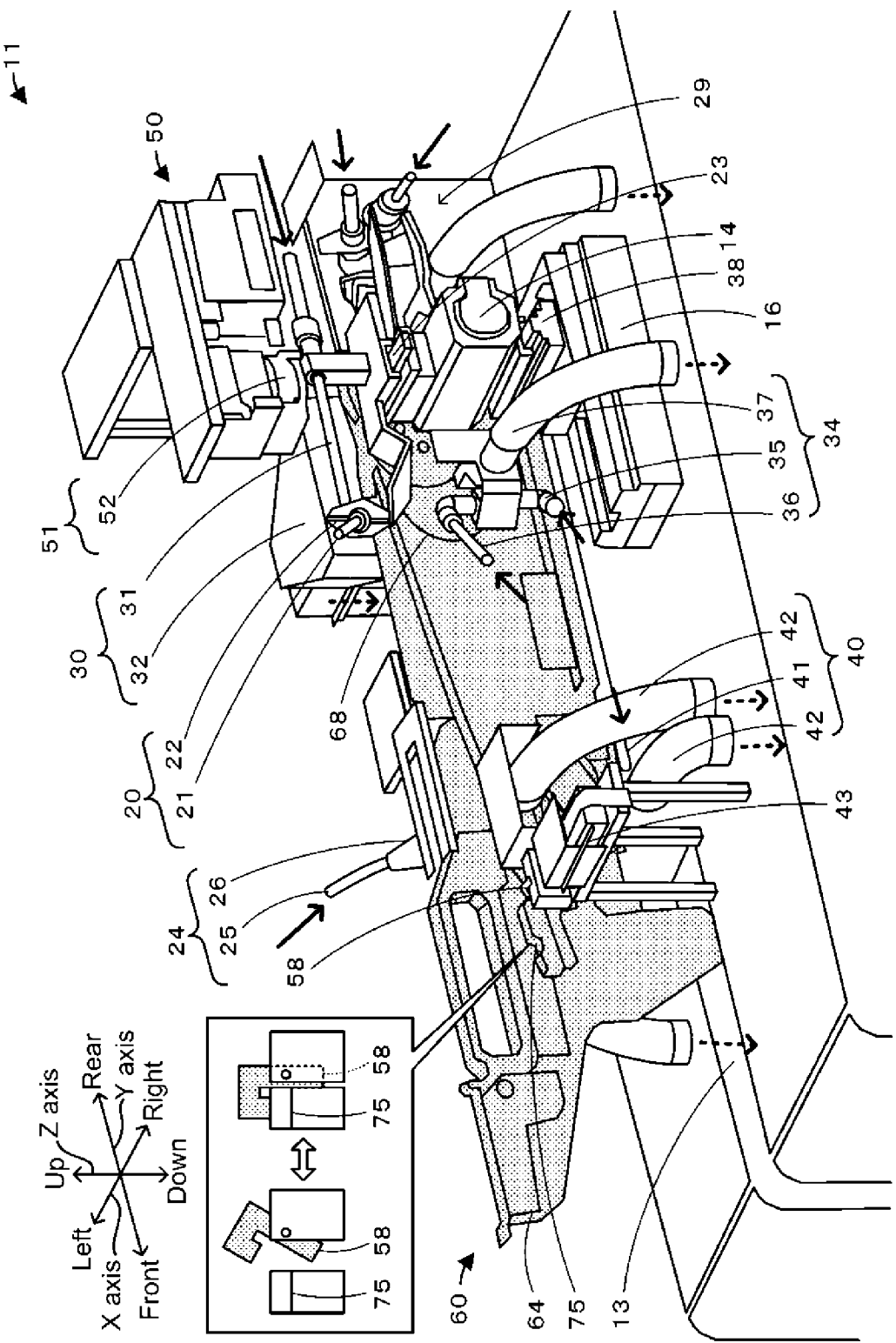
FIG. 4 is a diagram of feeder mounting section 13 of feeder maintenance apparatus 11.
Figure 5:
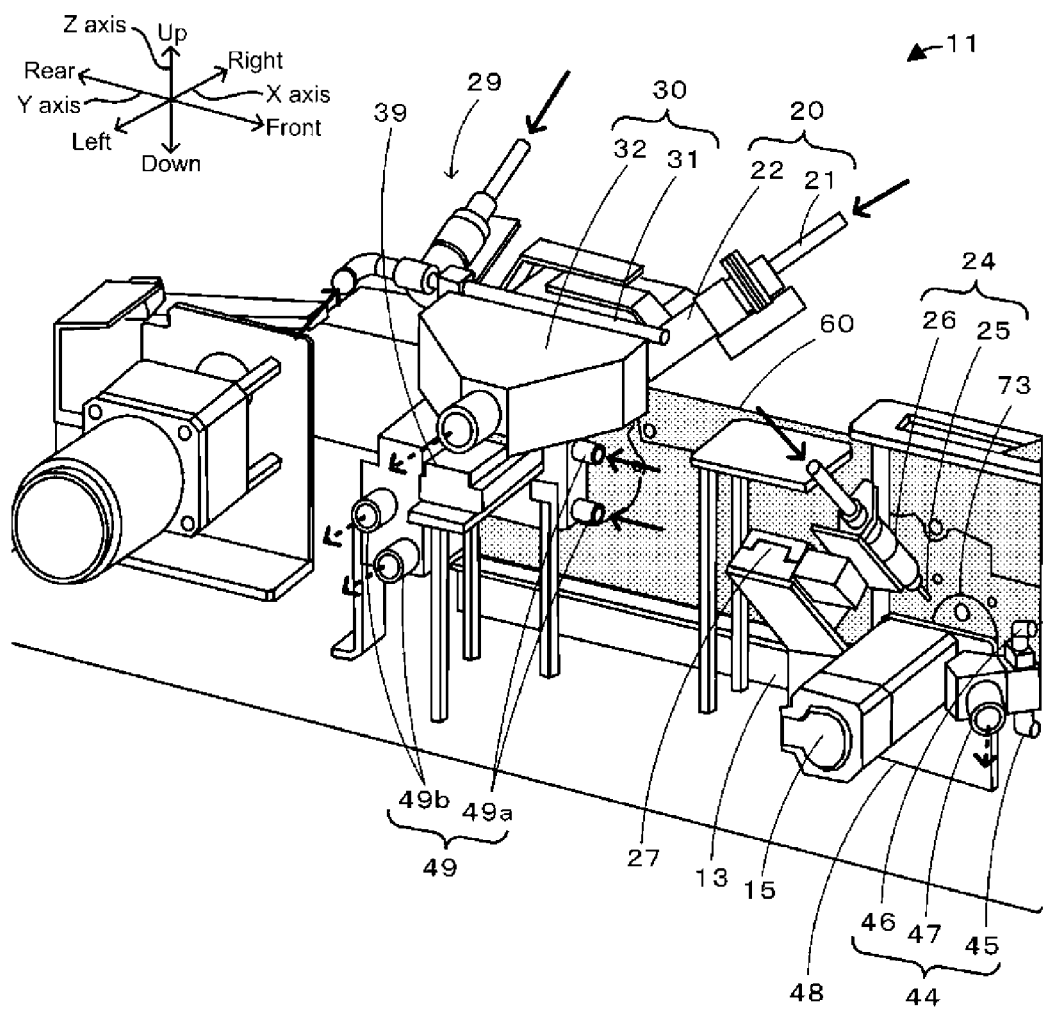
FIG. 5 is a diagram of feeder mounting section 13 of feeder maintenance apparatus 11.
Figure 6:
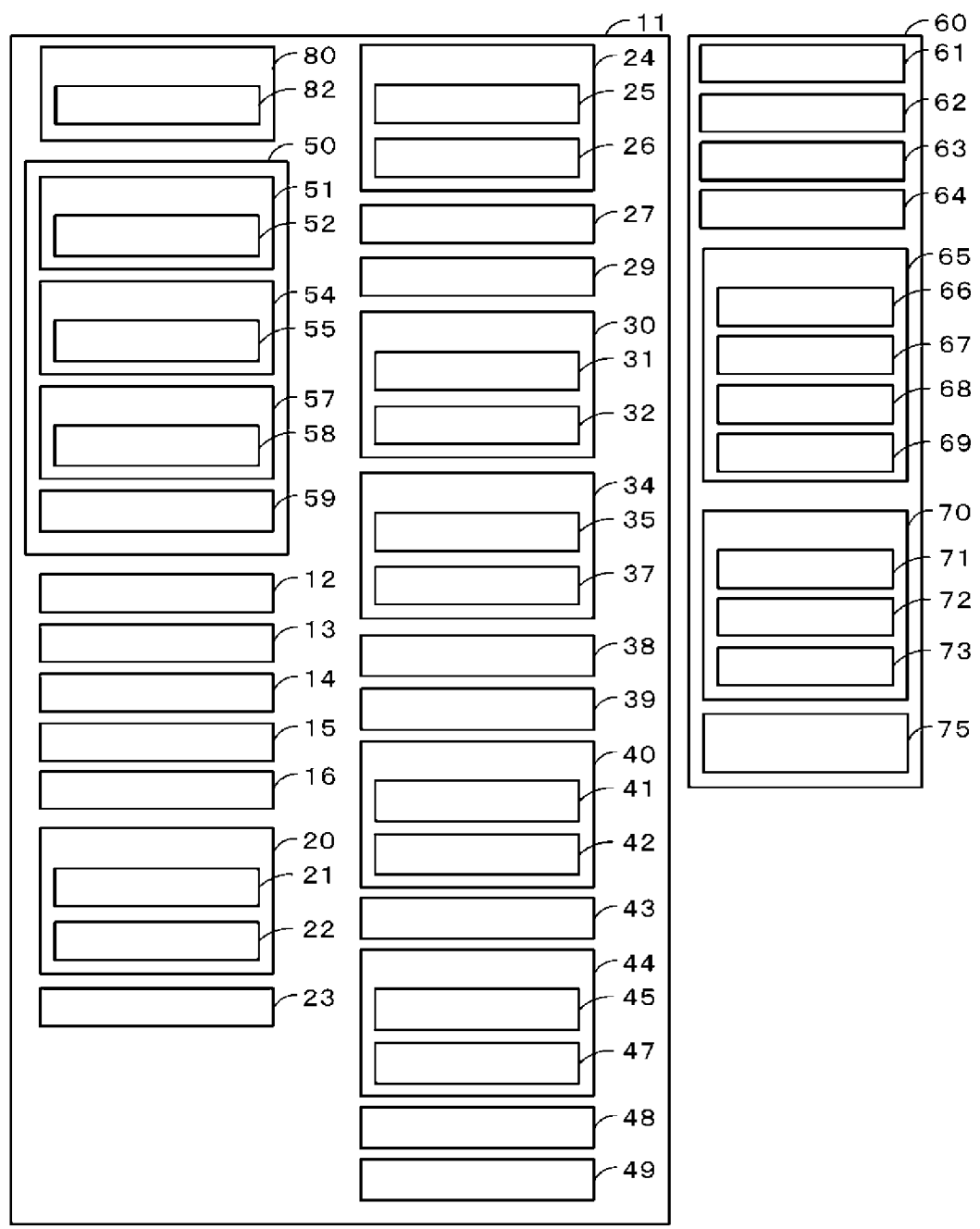
FIG. 6 is a block diagram showing the configuration of feeder maintenance apparatus 11.

Hereinafter, description will be given of a favorable embodiment of the present disclosure with reference to the drawings. FIG. 1 is a schematic diagram of feeder maintenance system 10. FIG. 2 is a schematic diagram of feeder 60. FIG. 3 is a schematic diagram of feeder 60B. FIG. 4 is a diagram of feeder mounting section 13 of feeder maintenance apparatus 11. FIG. 5 is a diagram of feeder mounting section 13 of feeder maintenance apparatus 11. FIG. 6 is a block diagram showing the configuration of feeder maintenance apparatus 11. Feeder maintenance system 10 of the present embodiment is provided with feeder maintenance apparatus 11 and management computer (PC) 90. Feeder maintenance apparatus 11 is an apparatus which performs the maintenance and inspection of feeders 60, 60B, and the like which are mounted to mounting device that mounts components onto a board. Feeder maintenance apparatus 11 is configured with feeder mounting section 13 onto which it is possible to mount multiple types of feeder. Here, using feeder 60 and feeder 60B as examples, description will be given mainly using feeder 60. Management PC 90 is a PC that manages information and the like which is handled by the feeder maintenance apparatus 11. In the present embodiment, a left-right direction (an X-axis), a front-back direction (a Y-axis), and an up-down direction (a Z-axis) are as illustrated in FIGS. 1 to 3.

Feeder 60 is mounted to a mounting device (not illustrated) and supplies components to a mounting unit which holds the components and moves the components in the XY-directions. When feeder 60 is mounted to the mounting device, reel 79 (refer to FIG. 2) on which a tape which houses components is wound is mounted to feeder 60 to be capable of axial rotation. As illustrated in FIGS. 2 and 6, feeder 60 is provided with controller 61, memory section 62, connector 63, reel mounting section 64, feeding mechanism 65, member processing mechanism 70, and splicing sensor 75. Controller 61 performs overall control of feeder 60. Memory section 62 is, for example, flash memory, and information relating to feeder 60, for example, type information, identification information, information of reel 79 which is mounted, information of the components which are held in the reel, and the like of feeder 60 is stored in memory section 62. Connector 63 is connected to a connector of the mounting device and a connector of feeder maintenance apparatus 11, and allows communication between the control sections of these items. Reel mounting section 64 mounts reel 79 in a detachable manner.

Feeding mechanism 65 is a mechanism which feeds the tape which is pulled out from reel 79. Feeding mechanism 65 is provided with sprocket 67, first gear mechanism 68, and first driving motor 69. A top portion periphery of a leading end of feeder 60 at which the external teeth of sprocket 67 are exposed is referred to as sprocket section 66. Sprocket 67 is a type of external gear and serves a role of feeding the tape which is unwound from reel 79 toward the rear. First gear mechanism 68 is a mechanism which transmits a driving force of first driving motor 69 to sprocket 67 and is configured using multiple gears of varying size. First driving motor 69 is a motor which rotationally drives sprocket 67, and may be a stepping motor. Member processing mechanism 70 is a mechanism which feeds and discards a top film (a sealing member) which is peeled from a bottom tape. Member processing mechanism 70 is provided with a feeding roller 71, second gear mechanism 72, and second driving motor 73. Feeding roller 71 grips the top tape and feeds the top tape to the outside. Second gear mechanism 72 is a mechanism which transmits a driving force of second driving motor 73 to feeding roller 71, and includes one or more gears. Second driving motor 73 is a motor which rotationally drives feeding roller 71 and may be a stepping motor.

The tape (not illustrated) is configured using a bottom tape in which cavities (recessed sections) are formed at a predetermined pitch in the longitudinal direction, and a top film which covers the surface of the bottom tape in a state with a component P housed in each of the cavities. After the top film is peeled from the bottom tape in front of the component supply position of the mounting device and is moved along a film guide, the top film is pinched by feeding roller 71 of member processing mechanism 70, is fed to the outside, and is discarded. Feeding holes which are lined up along the longitudinal direction of the tape are further formed in the bottom tape. External teeth of sprocket 67 engage with the feeding holes. The tape moves along guide frame 76 (refer to FIG. 2) which is provided on both sides on the left and right f feeder 60 and which extends in the front-back direction. Circular fiducial mark 77 which serves as a reference position is formed on guide frame 76. The mounting device and feeder maintenance apparatus 11 are set to obtain an error in the feeding amount of the tape based on the positional relationship between the feeding holes of the tape and fiducial mark 77.

Splicing sensor 75 is a sensor which detects a joining portion of the tape. In feeder 60, at the final stage of using the tape, a process (a splicing process) of connecting and fixing a tail end of the tape which is in use to a leading end of the tape of a new reel may be performed. In feeder 60, the joining portion is detected using splicing sensor 75, and it is possible to continuously perform the management of the new reel 79. In the splicing process, a metal fixing member is used, and splicing sensor 75 is configured as a sensor which detects metal.

Next, description will be given of feeder 60B using FIG. 3. Since the basic structure of feeder 60B is the same as that of feeder 60, the same symbols will be assigned to the same configurations, and description thereof will be omitted. Feeder 60B is provided with feeding mechanism 65B and member processing mechanism 70B. Feeding mechanism 65B is provided with sprocket section 66B which includes sprocket 67B, first gear mechanism 685, and first driving motor 69B. Member processing mechanism 70B is provided with feeding roller 71B and second gear mechanism 72B. Second gear mechanism 72B meshes with first driving motor 69B. In other words, in feeder 60B, first driving motor 69B also functions as second driving motor, and a configuration adopted in which a single driving motor is provided. In second gear mechanism 72B, a belt driving section is included in addition to gears.

Next, description will be given of feeder maintenance apparatus 11 which maintains and inspects feeders 60 and 60B. As illustrated in FIGS. 1 and 4 to 6, feeder maintenance apparatus 11 is provided with cover 12, feeder mounting section 13, first driving motor 14, second driving motor 15, and position adjustment mechanism 16. Feeder maintenance apparatus 11 is provided with lubricant supply sections 20, 24, and 29, supply section moving mechanisms 23 and 27, air washing sections 30, 40, and 49, liquid washing sections 34 and 44, cleaning section moving mechanisms 38, 39, and 48, member moving mechanism 43, inspection unit 50, and control section 80.

Cover 12 is a member which covers the top of feeder mounting section 13, is opened when mounting feeder 60 to feeder mounting section 13, and is closed when performing maintenance and inspection of feeder 60. Feeder mounting section 13 is a section on which is mounted feeder 60 and feeder 60B which are used in a mounting device which mounts components onto a board, and a connecting section (not illustrated) which connects to connector 63 is installed on feeder mounting section 13. First driving motor 14 is a motor which drives a gear of the feeding mechanism 65 side of feeder 60, and is installed on the right side of the rear portion of the apparatus (refer to FIG. 4). First driving motor 14 is provided with an engaging section (not illustrated). The engaging section is inserted into a hole portion which is formed in the gear of first gear mechanism 68. In this state, first driving motor 14 is capable of rotationally driving the gear of first gear mechanism 68. Second driving motor 15 is a motor which drives a gear of the member processing mechanism 70 side of feeder 60, and is installed on the left side of the front portion of the apparatus (refer to FIG. 5). Second driving motor 15 is provided with a similar engaging section to that of first driving motor 14.

Position adjustment mechanism 16 causes feeder 60 which is mounted to feeder mounting section 13 to move relative to the lubricant supply section and the cleaning section. Position adjustment mechanism 16 moves first driving motor 14, lubricant supply sections 20 and 29, air washing section 30, liquid washing section 34, and the like in the front-back direction at the rear portion side of the apparatus (the front portion side of feeder 60). In the present embodiment, to facilitate explanation, air washing sections 30 and 40, liquid washing sections 34 and 44, and the like which clean feeder 60 are collectively referred to as the cleaning section. In feeder maintenance apparatus 11, the configurations which face member processing mechanism 70 of feeder 60 serve as a reference position and are not moved in the front-back direction, and the configurations which face feeding mechanism 65 are moved in the front-rear direction. In this manner, in feeder maintenance apparatus 11, the lubricant supply section and the cleaning section are caused to face the configurations of the feeder, and it is possible to treat multiple types of feeder with the supplying of the lubricant, the cleaning of the configurations, and the like. Position adjustment mechanism 16 is configured using a guide member which is formed in the front-back direction of the apparatus, a slider on which a configuration which performs the maintenance process (the lubricant supply section and the cleaning section) is installed and which is moved while being guided by a guide section, and an actuator which moves the slider. In feeder maintenance apparatus 11, for example, configurations to which lubricant is not to be applied, such as the sprocket 67 and the feeding roller 71, in order to prevent slipping, adherence of foreign matter, and the like caused by the lubricant, are cleaned using air. In feeder maintenance apparatus 11, for example, configurations which are to be lubricated using the lubricant, such as first gear mechanism 68 and second gear mechanism 72, are cleaned using a washing liquid.

Lubricant supply section 20 supplies a lubricant (for example, a grease or a lubricating oil) to the driving section (first gear mechanism 68) of feeding mechanism 65 of feeder 60 (refer to FIG. 4). In FIGS. 4 and 5, only a portion of the various supply pipes and the like are depicted in order to display the other configurations. In FIGS. 4 and 5, a portion or all of the cover members and the like are omitted in order to display the other configurations. In FIGS. 4 and 5, the lubricant, the air, the washing liquid, and the like which are supplied are assigned solid line arrows on the supply side, and dotted line arrows on the side at which these are collected. Lubricant supply section 20 is provided with lubricant supply pipe 21, cylinder 22, and a positioning member (not illustrated). Lubricant supply pipe 21 is formed using a member which is made of resin and is flexible. Cylinder 22 stores the lubricant which is supplied from the outside, and discharges the lubricant from lubricant supply pipe 21 using air pressure. The positioning member is a member into which lubricant supply pipe 21 is inserted, and supports lubricant supply pipe 21 in a fixed manner. Lubricant supply pipe 21 is inserted into the positioning member, and a through-hole which guides the distal end of lubricant supply pipe 21 to a predetermined lubricant supply position is formed in the positioning member. The positioning member is adjusted such that the distal end of lubricant supply pipe 21 is fixed to a position which does not interfere with the movement of the gears of first gear mechanism 68. Lubricant supply section 20 is installed in supply section moving mechanism 23. Supply section moving mechanism 23 moves lubricant supply section 20 between a predetermined maintenance position and a predetermined retraction position. Supply section moving mechanism 23 is configured using a guide member which is formed in the left-right direction of the apparatus, a slider on which lubricant supply section 20 is installed and which is moved while being guided by a guide section, and an actuator which moves the slider. Lubricant supply section 29 (refer to FIG. 4) supplies the lubricant to first gear mechanism 68, and is provided with a lubricant supply pipe, a cylinder, a positioning member, and the like; however, specific description thereof will be omitted as similar to lubricant supply section 20.

Lubricant supply section 24 supplies the lubricant to the driving section (the second gear mechanism 72) of member processing mechanism 70 of feeder 60 (refer to FIG. 5). Lubricant supply section 24 is provided with lubricant supply pipe 25, cylinder 26, and a positioning member (not illustrated). The configurations of lubricant supply section 24 are similar to those of lubricant supply section 20, and description thereof will be omitted here. Lubricant supply section 24 is installed in supply section moving mechanism 27. Supply section moving mechanism 27 moves lubricant supply section 24 between a predetermined maintenance position and a predetermined retraction position. Supply section moving mechanism 27 is configured using a guide member which is formed in the left-right direction of the apparatus, a slider on which lubricant supply section 24 is installed and which is moved while being guided by a guide section, and an actuator which moves the slider.

Air washing section 30 cleans sprocket section 66 (a feeding section) of the feeding mechanism 65 using air. Air washing section 30 removes foreign matter (for example, a portion of the top film, dust of the adhesive which adheres the top film, and the like), such as dust which is adhered to sprocket section 66, by blowing air onto sprocket section 66. Air washing section 30 is provided with air supply section 31 and suction section 32. Air supply section 31 is a pipe-shaped member in which a hole is formed in the bottom side face, and which is disposed along guide frame 76 of feeder 60. An air supply pipe is connected to air supply section 31, and air is supplied from a compressor (not illustrated) via the air supply pipe. Suction section 32 sucks in air via sprocket section 66, and is provided with a cover which covers the top portion of sprocket section 66, and a suction pipe which is connected to the cover. The suction pipe is connected to a vacuum generator (not illustrated). Air supply section 31 is installed on supply section moving mechanism 23, and is moved between the cleaning position and the retraction position by supply section moving mechanism 23. Suction section 32 is installed on cleaning section moving mechanism 39 (refer to FIG. 5), and is moved between the cleaning position and the retraction position by cleaning section moving mechanism 39. Cleaning section moving mechanism 39 is configured using a guide member which is formed in the left-right direction of the apparatus, a slider on which suction section 32 is installed and which is moved while being guided by a guide section, and an actuator which moves the slider.

Liquid washing section 34 cleans first gear mechanism 68 (driving section) of feeding mechanism 65 using a washing liquid. Liquid washing section 34 removes the old lubricant which is adhered to first gear mechanism 68 using the washing liquid. Liquid washing section 34 is provided with liquid supply section 35, air supply section 36, and collection section 37. A washing liquid supply pipe is connected to liquid supply section 35, and the washing liquid is supplied from a tank (not illustrated) via the washing liquid supply pipe. An air supply pipe is connected to air supply section 36, and air is supplied from a compressor (not illustrated) via the air supply pipe. Liquid washing section 34 sprays the washing liquid onto the gears of first gear mechanism 68 from a discharging port using the air which is discharged from air supply section 36. The washing liquid includes an organic solvent which is capable of dissolving the lubricant. Examples of the organic solvent include alcohol, acetone, isohexane, and the like. Collection section 37 collects the washing liquid via first gear mechanism 68, and is provided with a receiving member which is disposed to surround the discharging port, and a collection pipe which is connected to the receiving member. The collection pipe is connected to a vacuum generator (not illustrated). Liquid washing section 34 is installed on cleaning section moving mechanism 38, and is moved between the cleaning position and the retraction position by cleaning section moving mechanism 38. Cleaning section moving mechanism 38 is configured using a guide member which is formed in the left-right direction of the apparatus, a slider on which liquid washing section 34 is installed and which is moved while being guided by a guide section, and an actuator which moves the slider.

Air washing section 40 cleans feeding roller 71 (feeding section) of member processing mechanism 70 using air. Air washing section 40 removes foreign matter (for example, a portion of the top film, dust of the adhesive which adheres the top film, and the like) such as dust which is adhered to feeding roller 71 by blowing air onto feeding roller 71. Air washing section 40 is provided with air supply section 41 and suction section 42. An air supply pipe is connected to air supply section 41, and air is supplied from a compressor (not illustrated) via the air supply pipe. Suction section 42 sucks in air via feeding roller 71, and is provided with a cover (not illustrated) which covers feeding roller 71, and a suction pipe which is connected to the cover. The suction pipe is connected to a vacuum generator (not illustrated).

Liquid washing section 44 cleans second gear mechanism 72 (the driving section) of member processing mechanism 70 using the washing liquid (refer to FIG. 5). Liquid washing section 44 is provided with liquid supply section 45, air supply section 46, and collection section 47. Liquid supply section 45, air supply section 46, and collection section 47 have similar configurations to liquid supply section 35, air supply section 36, and collection section 37, respectively, and so specific description thereof will be omitted here. Liquid washing section 44 is installed on cleaning section moving mechanism 48, and is moved between the cleaning position and the retraction position by cleaning section moving mechanism 48. Cleaning section moving mechanism 48 is configured using a guide member which is formed in the left-right direction of the apparatus, a slider on which liquid washing section 44 is installed and which is moved while being guided by a guide section, and an actuator which moves the slider (not illustrated).

Air washing section 49 is installed on the rear left side of the apparatus, and cleans first gear mechanism 68 from the left side of feeder 60 using air. Air washing section 49 is provided with air supply section 49a and suction section 49b; however, specific description thereof will be omitted as similar to that of air washing section 40. Air washing section 49 is installed on cleaning section moving mechanism 39 and is moved between the cleaning position and the retraction position.

Inspection unit 50 is configured using feed accuracy inspection section 51, torque inspection section 54, splicing inspection section 57, and inspection section moving mechanism 59. Feed accuracy inspection section 51 inspects the feed accuracy of the tape in feeder 60. Feed accuracy inspection section 51 is provided with imaging section 52 and a reference tape insertion section. Imaging section 52 is configured as a digital camera which images sprocket section 66 from above. The reference tape insertion section inserts a reference tape from the rear (the distal end side of feeder 60) of the apparatus into sprocket section 66. The reference tape may be a member which does not deform easily, for example, and may be formed using a metal thin plate, for example. Feed accuracy inspection section 51 captures an image when the reference tape is fed by a predetermined amount by first driving motor 69, and obtains the feed accuracy based on the expected feeding amount and the feeding amount which is actually measured through imaging. Feed accuracy inspection section 51 inspects whether feeding mechanism 65 is operating correctly based on the feed accuracy. Feed accuracy inspection section 51 is installed on inspection section moving mechanism 59, and is moved between the inspection position and the retraction position by inspection section moving mechanism 59. Inspection section moving mechanism 59 is configured using a guide member which is formed in the front-back direction of the apparatus, a slider on which imaging section 52 is installed and which is moved while being guided by a guide section, and an actuator which moves the slider (not illustrated). Torque inspection section 54 is provided with torque detection section 55 which measures the driving load of the mechanism (for example, first gear mechanism 68 or sprocket 67) which feeds the tape of feeder 60. Torque detection section 55 is installed on supply section moving mechanism 23, for example, and is moved between the inspection position and the retraction position by supply section moving mechanism 23. Torque inspection section 54 inspects the driving load of first gear mechanism 68 or sprocket 67 based on the output value from torque detection section 55 which is obtained by driving first driving motor 69 after torque detection section 55 is connected to first gear mechanism 68. Splicing inspection section 57 inspects splicing sensor 75 and is provided with dummy member 58. Dummy member 58 is formed using a member (metal) which is used in splicing. Dummy member 58 is installed on member moving mechanism 43, and is moved between the inspection position and the retraction position by member moving mechanism 43. Dummy member 58 has a hooked claw shape, and when the vertical surface of dummy member 58 comes into contact with the side face of splicing sensor 75 in accordance with the movement of member moving mechanism 43, the distal end of the hooked claw comes into contact with splicing sensor 75 (refer to FIG. 4). Splicing inspection section 57 inspects whether splicing sensor 75 is operating normally based on the output value of the sensor when dummy member 58 comes into contact with splicing sensor 75.

Control section 80 is configured as a programmable logic controller (PLC) centered on CPU 82, and performs overall control of the apparatus. Control section 80 has a function as an acquisition section which acquires information of feeder 60 via connector 63 from feeder 60 which is mounted on feeder mounting section 13. For example, the information of feeder 60 includes information of the type of feeder 60, identification information of feeder 60, and the like. Control section 80 has a function of controlling position adjustment mechanism 16, and supply section moving mechanisms 23 and 27 such that the positional relationship between the driving section of feeder 60 and lubricant supply sections 20, 24, and 29 assumes a predetermined maintenance position based on the information of feeder 60 which is acquired. Control section 80 has a function of controlling lubricant supply sections 20, 24, and 29 to supply the lubricant to the driving section. Furthermore, control section 80 has a function of controlling cleaning section moving mechanisms 38, 39, 43, and 48 such that the positional relationship between feeder 60 and the cleaning section assumes a predetermined cleaning position based on the information of feeder 60 which is acquired. Control section 80 has a function of controlling the cleaning section to clean feeder 60. Still further, control section 80 has a function of causing the inspection by inspection unit 50 to be performed after cleaning a predetermined portion of feeder 60.

As illustrated in FIG. 1, management PC 90 is provided with control section 91, HDD 92, and communication section 94. Control section 91 is configured as a microprocessor which is centered on a CPU, and is provided with a ROM which stores a processing program, a RAM which is used as a working region, and the like. Management PC 90 is provided with an input device such as a keyboard and a mouse with which an operator inputs various commands, and a display which displays various information. HDD 92 of management PC 90 stores feeder information 93 which is a database relating to the feeder which is used in the mounting process of the mounting device, and the like.

Next, description will be given of the movements of feeder maintenance system 10 of the present embodiment which is configured in this manner, in particular, the movements of feeder maintenance apparatus 11. FIG. 7 is a flowchart representing an example of the feeder cleaning inspection process routine which is performed by CPU 82 of control section 80. The routine is stored in control section 80, and is performed according to a cleaning inspection start instruction by the operator. When the routine is started, CPU 82 first acquires the feeder information from feeder 60 which is mounted in feeder mounting section 13 (step S100). The feeder information includes information of the type, identification information, and the like of the feeder.

Next, CPU 82 moves the cleaning section to the cleaning position corresponding to the type of the feeder (step S110). Here, CPU 82 controls position adjustment mechanism 16, cleaning section moving mechanisms 38, 39, 43, and 48, and the like, and moves air washing sections 30, 40, and 49, liquid washing sections 34, 44, and the like to the cleaning position. Next, CPU 82 performs the cleaning process which uses air using air washing sections 30 and 40 (step S120). At this time, CPU 82 supplies air to air supply sections 31, 41, and 49a, and sucks air using suction sections 32, 42, and 49b. Then, in feeder 60, the foreign matter which is adhered to sprocket section 66, feeding roller 71, and the like onto which the air is blown is removed. Next, CPU 82 performs the cleaning process which uses the washing liquid using liquid washing sections 34 and 44 (step S130). At this time, CPU 82 causes liquid supply sections 35 and 45 to supply the washing liquid, causes air supply sections 36 and 46 to supply air, and further, causes the washing liquid to be collected by collection sections 37 and 47. Then, in feeder 60, the old lubricant and the like is removed from first gear mechanism 68 and second gear mechanism 72 onto which the washing liquid is blown. The supply amounts of the air for cleaning and the washing liquid may be set, as appropriate, to favorable values which are acquired empirically through testing or the like.

Next, CPU 82 moves lubricant supply sections 20 and 24 to the maintenance positions corresponding to the type of feeder (step S140). Here, CPU 82 controls supply section moving mechanisms 23 and 27, and the like, and moves lubricant supply pipes 21 and 25, and the like to the maintenance positions. Next, CPU 82 causes the supplying process of the lubricant to first gear mechanism 68 and second gear mechanism 72 to be performed using lubricant supply sections 20 and 24 (step S150). In this process, CPU 82 causes the lubricant to be intermittently discharged from lubricant supply section 20 and lubricant supply section 29 at a predetermined interval while driving first driving motor 14 and causing first gear mechanism 68 to rotate. CPU 82 causes the lubricant to be intermittently discharged from lubricant supply section 24 at a predetermined interval while driving second driving motor 15 and causing second gear mechanism 72 to rotate. First gear mechanism 68 and second gear mechanism 72 cause the lubricant to reach the entirety of themselves in accordance with the continued rotation. The discharge amount and the discharge interval of the lubricant may be set, as appropriate, to favorable values which are acquired empirically through testing or the like.

When the automatic cleaning of feeder 60 and the automatic supplying of the lubricant are completed, CPU 82 causes inspection unit 50 to perform inspection of feeder 60 (steps S160 to S180). First, CPU 82 causes the feed accuracy inspection process of the tape of feeding mechanism 65 to be performed by feed accuracy inspection section 51 (step S160). In this process, the CPU 82 first controls inspection section moving mechanism 59 such that feed accuracy inspection section 51 comes to the inspection position from the retraction position. Next, CPU 82 causes the reference tape to be inserted into the distal end portion of feeder 60 using the reference tape insertion section, and drives first driving motor 14 to feed the reference tape into sprocket section 66. Next, CPU 82 drives first driving motor 69 and causes imaging section 52 to image the moving state of the reference tape. For example, CPU 82 performs a process of obtaining the error in the feeding amount of feeding mechanism 65 using the positional relationship between fiducial mark 77 and a feeding hole of the reference tape.

Next, CPU 82 drives first driving motor 69 and causes the torque inspection process to be performed by torque detection section 55 (step S170). In this process, CPU 82 detects the driving load of first gear mechanism 68 and the like using torque detection section 55. Next, CPU 82 causes the inspection process of splicing sensor 75 to be performed using splicing inspection section 57 (step S180). In this process, CPU 82 drives member moving mechanism 43, causes the distal end of dummy member 58 to be positioned on the top portion of splicing sensor 75, and acquires the detection signal from splicing sensor 75. CPU 82 stores the inspection result in association with the identification information of feeder 60 (step S190). The inspection result is stored in the database for each feeder.

Next, CPU 82 determines whether feeder 60 passes inspection (step S200). CPU 82 determines whether the inspection is successfully cleared based on whether the error in the feeding amount which is obtained in the feed accuracy inspection is within a predetermined permissible range, for example. CPU 82 determines whether the inspection is successfully cleared based on whether the driving load which is obtained in the torque inspection is within a predetermined permissible range, for example. CPU 82 determines whether the inspection is successfully cleared based on whether the detection signal is received from splicing sensor 75 in the splicing inspection. In a case in which CPU 82 determines that the inspections are all successfully cleared, CPU 82 determines that feeder 60 passes inspection, and in a case in which one or more of any of the inspections is not successfully cleared, CPU 82 determines that feeder 60 does not pass inspection passed. In a case in which feeder 60 passes inspection in step S200, CPU 82 causes an inspection passes screen to be displayed on the display of management PC 90 (step S210). Meanwhile, in a case in which feeder 60 does not pass inspection in step S200, CPU 82 causes a screen which includes an item for which inspection was not passed to be displayed on the display of management PC 90 (step S220). CPU 82 causes an instruction screen indicating that the feeder 60 is to be removed to be displayed on the display of management PC 90 (step S230), causes the configurations to move to the retraction positions, and ends the routine.

Here, the correspondence relationship between constituent elements of the present embodiment and constituent elements of the present disclosure will be made clear. Feeder mounting section 13 of the present embodiment corresponds to the mounting section of the present disclosure, control section 80 corresponds to the acquisition section and the control section, lubricant supply sections 20, 24, and 29 correspond to the lubricant supply section, and air washing sections 30, 40, and 49 and liquid washing sections 34 and 44 correspond to the cleaning section. Feeding mechanism 65 corresponds to the feeding mechanism, member processing mechanism 70 corresponds to the member processing mechanism, position adjustment mechanism 16 and supply section moving mechanisms 23 and 27 correspond to the supply section moving mechanism, position adjustment mechanism 16 and cleaning section moving mechanisms 38, 39, and 48 correspond to the cleaning section moving mechanism, and the top film corresponds to the sealing member. First gear mechanism 68 and first driving motor 69 correspond to the driving section of the feeding mechanism, second gear mechanism 72 and second driving motor 73 correspond to the driving section of the member processing mechanism, sprocket section 66 corresponds to the feeding section of the feeding mechanism, and feeding roller 71 corresponds to the feeding section of the member processing mechanism. Air washing sections 30, 40, and 49 correspond to the air washing section, air supply sections 31, 41, and 49a correspond to the air supply section, and suction section 32, 42, and 49b correspond to the suction section. Liquid washing sections 34 and 44 correspond to the liquid washing section, liquid supply sections 35 and 45 and air supply sections 36 and 46 correspond to the washing liquid supply section, and collection sections 37 and 47 correspond to the collection section. Feed accuracy inspection section 51 corresponds to the feed accuracy inspection section, torque inspection section 54 corresponds to the torque inspection section, splicing inspection section 57 corresponds to the splicing inspection section, and splicing sensor 75 corresponds to the detection sensor. In the present embodiment, an example of the control method of the feeder maintenance apparatus of the present disclosure is made clear from the description of operation of feeder maintenance apparatus 11.

In feeder maintenance apparatus 11 of the present embodiment which is described hereinabove, CPU 82 acquires the feeder information from feeder 60 which is mounted on the feeder mounting section 13, and controls lubricant supply sections 20, 24, and 29 to supply the lubricant to the driving section of feeder 60 based on the feeder information which is acquired. In this manner, since the feeder maintenance apparatus performs the supplying of the lubricant, in comparison with a case in which the operator performs the supplying of the lubricant, it is possible to further reduce variation in the quality of the maintenance. Since CPU 82 supplies the lubricant to the driving section of feeding mechanism 65 and the driving section of member processing mechanism 70 using the lubricant supply section, it is possible to further reduce variation in the quality of the maintenance of the driving sections. Furthermore, CPU 82 controls position adjustment mechanism 16 and supply section moving mechanisms 23 and 27 such that lubricant supply sections 20, 24, and 29 assume the predetermined maintenance position, and subsequently, since CPU 82 causes the lubricant to be supplied, it is possible to perform the maintenance process at a position corresponding to the maintenance target feeder.

Since CPU 82 controls the cleaning section to clean the predetermined portion of feeder 60 based on the feeder information, in comparison with a case in which the operator performs the cleaning, it is possible to further reduce variation in the quality of the maintenance. Furthermore, since CPU 82 cleans sprocket section 66 (the feeding section) of feeding mechanism 65 and feeding roller 71 (the feeding section) of member processing mechanism 70 using air, it is possible to remove foreign matter such as dust which is present on the feeding sections using air. Furthermore, since air washing sections 30, 40, and 49 include suction sections 32, 42, and 49b which suck in air via the feeding section, it is possible to collect the foreign matter. Since CPU 82 cleans the driving section of feeding mechanism 65 and the driving section of member processing mechanism 70 using the washing liquid, it is possible to more suitably clean the driving sections. Since liquid washing sections 34 and 44 include collection sections 37 and 47, it is possible to collect the washing liquid after the washing. Furthermore, since CPU 82 controls position adjustment mechanism 16 and cleaning section moving mechanisms 38, 39, 43, and 48 such that the cleaning section assumes a predetermined cleaning position based on the feeder information which is acquired, and thereafter the predetermined portion of feeder 60 is cleaned, it is possible to perform the maintenance process at a position corresponding to the maintenance target feeder.

Since CPU 82 controls the cleaning section to clean the predetermined portion of feeder 60, and after providing the driving section of feeder 60 with the lubricant causes inspection unit 50 to perform the inspection, it is possible to perform the inspection of the feeder in a state in which variation in the quality of the maintenance is further reduced, and it is possible to obtain more suitable inspection results.

The present disclosure is not limited to the embodiment which is described above, and, needless to say, may be implemented in various modes within the scope of the present disclosure.

For example, in the embodiment which is described above, the lubricant is supplied to both the driving section of feeding mechanism 65 and the driving section of member processing mechanism 70; however, the supplying may be performed on either one of these, and the lubricant may be supplied to other configurations instead of or in addition to either one of these, and alternatively, both may be omitted. For example, feeder maintenance apparatus 11 may be configured as an apparatus which performs only the cleaning process on feeder 60, and may be configured as an apparatus which performs only the lubricant supplying process on feeder 60. In this case, the processes which are not performed by the apparatus may be performed by the operator. It is preferable, as much as possible, to perform the application of the lubricant using the apparatus because variation arises easily due to the degree of skill of the operator.

In the embodiment which is described above, description is given with the premise that supply section moving mechanisms 23 and 27 which move the lubricant supply sections 20, 24, and 29 are provided; however, one or more of any of these may be omitted. Lubricant supply sections 20, 24, and 29 may be installed on any of cleaning section moving mechanisms 38, 39, 43, and 48, and one or more of any of the supply section moving mechanisms may be omitted. The supply section moving mechanism is configured to move the lubricant supply section; however, so long as the supply section moving mechanism is configured to change the relative positional relationship between feeder 60 and the lubricant supply section, the configuration is not limited thereto, and the supply section moving mechanism may be configured to move feeder 60, and may be configured to move the feeder 60 and the lubricant supply section.

In the embodiment which is described above, the cleaning section is configured to clean both the feeding section of feeding mechanism 65 and the feeding section of member processing mechanism 70; however, the cleaning may be performed on either one of these, and the cleaning may be performed on other configurations instead of or in addition to either one of these, and alternatively, the cleaning of both may be omitted. Since the cleaning of feeder 60 is a task which takes significant work, it is preferable to perform as much of the cleaning as possible using the apparatus.

In the embodiment which is described above, description is given in which cleaning section moving mechanisms 38, 39, 43, and 48 which move air washing sections 30, 40, 49 and liquid washing sections 34 and 44 (the cleaning section); however, one or more of any of these may be omitted. The cleaning sections may be installed on either of supply section moving mechanisms 23 and 27, and one or more of either of the cleaning section moving mechanisms may be omitted. The cleaning section moving mechanism is configured to move the cleaning section; however, if the cleaning section moving mechanism is configured to change the relative positional relationship between feeder 60 and the cleaning section, the configuration is not limited thereto, and the cleaning section moving mechanism may be configured to move feeder 60, and may be configured to move feeder 60 and the cleaning section.

In the embodiment which is described above, the feeder maintenance apparatus 11 is provided with inspection unit 50; however, the inspection unit 50 may be omitted. Even in this apparatus, it is possible to further reduce variation in the quality of the maintenance. Inspection unit 50 is configured from feed accuracy inspection section 51, torque inspection section 54, and splicing inspection section 57; however, one or more of these may be omitted, and inspection unit 50 may include another inspection section instead of or in addition to feed accuracy inspection section 51, torque inspection section 54, and splicing inspection section 57.

In the embodiment which is described above, description is given using feeder 60 as the maintenance target; however, the configuration is not particularly limited thereto. For example, the maintenance target may be feeder 60B. When feeder 60B is mounted to feeder mounting section 13, CPU 82 acquires the feeder information of feeder 60B via connector 63 and controls the position adjustment mechanism 16 based on the feeder information. Since feeder 60B does not have a maintenance target configuration on the left side of the part of the member processing mechanism 70B, CPU 82 allows second driving motor 15, lubricant supply section 24, and liquid washing section 44 (refer to FIG. 5) to rest based on the feeder information. In the same manner as with feeder 60 which is described above, the cleaning process and the lubricant supplying process are performed, and the inspection process is performed. With this apparatus too, it is possible to further reduce variation in the quality of the maintenance.

In the embodiment which is described above, the present disclosure is described as feeder maintenance apparatus 11; however, the present disclosure may be a control method of feeder maintenance apparatus 11 or a program which realizes the control method.

INDUSTRIAL APPLICABILITY

It is possible to use the present disclosure in the field of electronic component mounting.

REFERENCE SIGNS LIST

10: feeder maintenance system, 11: feeder maintenance apparatus, 12: cover, 13: feeder mounting section, 14: first driving motor, 15: second driving motor, 16: position adjustment mechanism, 20, 24, 29: lubricant supply section, 21, 25: lubricant supply pipe, 22, 26: cylinder, 23, 27: supply section moving mechanism, 30, 40, 49: air washing section, 31, 41, 49a: air supply section, 32, 42, 49b: suction section, 34, 44: liquid washing section, 35, 45: liquid supply section, 36, 46: air supply section, 37, 47: collection section, 38, 39, 48: cleaning section moving mechanism, 43: member moving mechanism, 50: inspection unit, 51: feed accuracy inspection section, 52: imaging section, 54: torque inspection section, 55: torque detection section, 57: splicing inspection section, 58: dummy member, 59: inspection section moving mechanism, 60, 60B: feeder, 61: controller, 62: memory section, 63: connector, 64: reel mounting section, 65, 65B: feeding mechanism, 66, 66B: sprocket section, 67, 67B: sprocket, 68, 68B: first gear mechanism, 69, 69B: first driving motor, 70, 70B: member processing mechanism, 71, 71B: feeding roller, 72, 72B: second gear mechanism, 73: second driving motor, 75: splicing sensor, 76: guide frame, 77: fiducial mark, 79: reel, 80: control section, 82: CPU, 90: management PC, 91: control section, 92: HDD, 93: feeder information, 94: communication section.

The invention claimed is:

1. A feeder maintenance apparatus, comprising:
a mounting section on which is mounted a feeder which supplies components and is configured for use in a mounting device that mounts the components onto a board;
a lubricant supply section on the mounting section, the lubricant supply section configured to supply a lubricant to a driving section of the feeder, the lubricant supply section provided on the mounting section;
an acquisition section which acquires feeder information from the feeder, the feeder information including a feeder type;
a position adjustment mechanism on the mounting section, the position adjustment mechanism configured to relatively move the feeder and the lubricant supply section in a front-back direction of the feeder; and
a control section configured to
control the position adjustment mechanism to arrange the lubricant supply section at a predetermined maintenance position determined based on the acquired feeder information, and
control the lubricant supply section to supply the lubricant at the predetermined maintenance position to the driving section of the feeder.

2. The feeder maintenance apparatus according to claim 1,
wherein the feeder is provided with a feeding mechanism which feeds a tape, and a member processing mechanism which feeds a sealing member which is peeled from the tape, and
wherein the lubricant supply section supplies the lubricant to one or more of the driving section of the feeder and a driving section of the member processing mechanism.

3. The feeder maintenance apparatus according to claim 1, further comprising:
a supply section moving mechanism on which the lubricant supply section is installed and that moves the lubricant supply section in a lateral direction relative to the feeder mounted to the mounting section,
wherein the control section controls the supply section moving mechanism to move the lubricant supply section to the predetermined maintenance position based on the feeder information which is acquired, and subsequently controls the lubricant supply section to supply the lubricant.

4. The feeder maintenance apparatus according to claim 1, further comprising:
a cleaning section which cleans a predetermined portion of the feeder,
wherein the control section controls the cleaning section to clean the predetermined portion of the feeder based on the acquired feeder information.

5. The feeder maintenance apparatus according to claim 4,
wherein the feeder is provided with a feeding mechanism which feeds a tape, and a member processing mechanism which feeds a sealing member which is peeled from the tape, and
wherein the cleaning section cleans one or more of the predetermined portion of the feeder and a predetermined portion of the member processing mechanism.

6. The feeder maintenance apparatus according to claim 4,
wherein the feeder is provided with a feeding mechanism which feeds a tape, and a member processing mechanism which feeds a sealing member which is peeled from the tape, and
wherein the cleaning section includes an air washing section which cleans either one or both of a feeding section of the feeding mechanism and a feeding section of the member processing mechanism using air.

7. The feeder maintenance apparatus according to claim 6,
wherein the cleaning section includes an air supply section which blows air onto the feeding section, and a suction section which sucks in air via the feeding section.

8. The feeder maintenance apparatus according to claim 4,
wherein the feeder is provided with a feeding mechanism which feeds a tape, and a member processing mechanism which feeds a sealing member which is peeled from the tape, and
wherein the cleaning section includes a liquid washing section which cleans either one or both of a driving section of the feeding mechanism and a driving section of the member processing mechanism using a washing liquid.

9. The feeder maintenance apparatus according to claim 8,
wherein the cleaning section includes a washing liquid supply section which supplies the washing liquid to the driving sections, and a collection section which collects the washing liquid via the driving sections.

10. The feeder maintenance apparatus according to claim 4, further comprising:
a cleaning section moving mechanism on which the cleaning section is installed and that moves the cleaning section relative to the feeder mounted to the mounting section,
wherein the control section controls the cleaning section moving mechanism to move the cleaning section to a predetermined cleaning position based on the acquired feeder information, and subsequently controls the cleaning section to clean the predetermined portion of the feeder.

11. The feeder maintenance apparatus according to claim 1, further comprising:
an inspection unit which includes one or more of a feed accuracy inspection section which inspects a feed accuracy of the tape in the feeder, a torque inspection section of a mechanism which feeds the tape in the feeder, and a splicing inspection section which inspects a detection sensor which detects a splicing portion of the tape in the feeder; and
a cleaning section which cleans the predetermined portion of the feeder,
wherein the control section controls the cleaning section to clean the predetermined portion of the feeder, and subsequently causes the inspection unit to perform inspection.

12. A control method in which a computer controls a feeder maintenance apparatus which is provided with a mounting section on which is mounted a feeder which is supplied components and is configured for use in a mounting device that mounts the components onto a board, and a lubricant supply section which supplies a lubricant to a driving section of the feeder, the lubricant supply section provided on the mounting section, the method comprising:

acquiring feeder information from the feeder mounted in the mounting section, the feeder information including a feeder type;

moving the feeder and lubricant supply section relative to each other in a front-back direction of the feeder to a predetermined maintenance position using a position adjustment mechanism on the mounting section, the predetermined maintenance position determined based on the acquired feeder information; and controlling the lubricant supply section to supply the lubricant at the predetermined maintenance position to the driving section of the feeder, the predetermined maintenance position determined based on the acquired feeder.

13. The control method according to claim 12 further comprising:

controlling a cleaning section to clean a second predetermined portion of the feeder based on the acquired feeder information.

* * * * *